(12) United States Patent
Kazama et al.

(10) Patent No.: US 10,931,932 B2
(45) Date of Patent: Feb. 23, 2021

(54) SUPPORTING HOUSING FOR STEREO CAMERA AND CIRCUIT BOARD

(71) Applicant: Hitachi Automotive Systems, Ltd., Hitachinaka (JP)

(72) Inventors: Atsushi Kazama, Tokyo (JP); Hidenori Shinohara, Hitachinaka (JP); Hiroaki Nagai, Hitachinaka (JP); Kenichi Takeuchi, Hitachinaka (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 204 days.

(21) Appl. No.: 16/306,989

(22) PCT Filed: Jul. 13, 2017

(86) PCT No.: PCT/JP2017/025489
§ 371 (c)(1),
(2) Date: Dec. 4, 2018

(87) PCT Pub. No.: WO2018/025606
PCT Pub. Date: Feb. 8, 2018

(65) Prior Publication Data
US 2020/0314408 A1   Oct. 1, 2020

(30) Foreign Application Priority Data

Aug. 2, 2016   (JP) ................. 2016-152105

(51) Int. Cl.
*H04N 13/239* (2018.01)
*H04N 5/225* (2006.01)
*G01C 3/08* (2006.01)

(52) U.S. Cl.
CPC ......... *H04N 13/239* (2018.05); *H04N 5/2252* (2013.01); *H04N 5/2258* (2013.01);
(Continued)

(58) Field of Classification Search
CPC .. H04N 13/239; H04N 5/2258; H04N 5/2252; H04N 5/22521; H04N 2213/001; G01C 3/085
(Continued)

(56) References Cited

U.S. PATENT DOCUMENTS

2009/0135246 A1* 5/2009 Uchiyama ............. G03B 35/08
                                                                  348/42
2010/0134127 A1    6/2010 Breinlinger et al.
(Continued)

FOREIGN PATENT DOCUMENTS

JP      3-242963 A    10/1991
JP    2012-510633 A     5/2012
(Continued)

OTHER PUBLICATIONS

International Search Report (PCT/ISA/210) issued in PCT Application No. PCT/JP2017/025489 dated Sep. 5, 2017 with English translation (five pages).
(Continued)

*Primary Examiner* — Marnie A Matt
(74) *Attorney, Agent, or Firm* — Crowell & Moring LLP

(57) ABSTRACT

The present invention provides a stereo camera capable of mitigating thermal stress generated between members and reducing measurement error. In the present invention, a housing is provided with a high-rigidity support part and low-rigidity support part for supporting a circuit board, a high-rigidity support area including the high-rigidity support part, and a low-rigidity support area including the low-rigidity support part. The high-rigidity support part has greater rigidity in relation to force acting in a baseline direction (X-axis direction) following a baseline length of a pair of camera modules than the low-rigidity support part. The high-rigidity support area is provided in one location so
(Continued)

as to be adjacent to the low-rigidity support area in the baseline direction.

17 Claims, 15 Drawing Sheets

(52) U.S. Cl.
CPC ......... *H04N 5/22521* (2018.08); *G01C 3/085* (2013.01); *H04N 2213/001* (2013.01)

(58) Field of Classification Search
USPC .......................................................... 348/47
See application file for complete search history.

(56) References Cited

U.S. PATENT DOCUMENTS

| | | | |
|---|---|---|---|
| 2012/0081550 A1 | 4/2012 | Sewell | |
| 2013/0033581 A1* | 2/2013 | Woo | H04N 5/2251 348/47 |
| 2014/0316198 A1* | 10/2014 | Krivopisk | A61B 1/051 600/109 |
| 2015/0029313 A1* | 1/2015 | Muller | H04N 13/0239 348/47 |
| 2015/0381860 A1* | 12/2015 | De Nardi | H04N 5/2253 348/376 |
| 2016/0037031 A1 | 2/2016 | Bull et al. | |
| 2016/0195799 A1* | 7/2016 | Koyama | G03B 17/561 |

FOREIGN PATENT DOCUMENTS

| | | |
|---|---|---|
| JP | 2013-545347 A | 12/2013 |
| JP | 2015-198224 A | 11/2015 |
| JP | 2016-36137 A | 3/2016 |

OTHER PUBLICATIONS

Japanese-language Written Opinion (PCT/ISA/237) issued in PCT Application No. PCT/JP2017/025489 dated Sep. 5, 2017 (three pages).
Extended European Search Report issued in European Application No. 17836713.2 dated Feb. 7, 2020 (right (8) pages).

\* cited by examiner

SUPPORTING HOUSING FOR STEREO CAMERA AND CIRCUIT BOARD

TECHNICAL FIELD

The present invention relates to a stereo camera.

BACKGROUND ART

In the related art, an invention related to a camera system having a mounting system is known (see PTL 1 below). This conventional camera system comprises a circuit board and a frame.

The circuit board has a first end to which a first camera is electrically connected and a second end to which a second camera is electrically connected. In addition, the frame has a first frame member, a second frame member, and a mount for attachment to a vehicle.

In addition, the circuit board is arranged between the first frame member and the second frame member. The first frame member is coupled to the second frame member at a first connection location proximate the first end and at a second connection location proximate the second end to reduce the deflection of the first and second ends of the circuit board relative to the mount to maintain the alignment of the first and second cameras (see claim 1 of PTL 1).

The first frame member and the second frame member are made of, for example, materials having similar linear expansion coefficients. In the second frame member, for example, the side opposite to the circuit board or a surface thereof is fixed to the first frame member. Thus, since the movement of the front surface and the rear surface of the circuit board is balanced, the expansion of the second frame member positioned on the front surface side of the circuit board can reduce deflection or twist of the circuit board (see paragraph [0018] and the like in PTL 1).

CITATION LIST

Patent Literature

PTL 1: JP 2013-545347 W

SUMMARY OF INVENTION

Technical Problem

In the case where the circuit board is arranged between the first frame member and the second frame member as in the conventional camera system, excessive force generated by a difference in the thermal expansion amount of the circuit board and the frame members may act on the connecting portions connecting the circuit board and the frame members. PTL 1 discloses a configuration that allows the circuit board to move relative to a support frame so as not to generate thermal stress (see FIGS. 8 and 9, paragraph [0029] and the like in PTL 1).

More specifically, the circuit board has two horizontally extending slots and one vertically extending slot, and each of the slots allows a portion of the circuit board local to the slot to move relative to the frame within a range of the slot. This allows the stresses to be relieved when the camera system is exposed to extreme temperatures. Each of the slots accommodates a fixing member slidably connecting the circuit board and the frame.

However, the ease of relative movement between the circuit board and the frame varies depending on the fastening force by the fixing member and the frictional force between the members, and thus reproducibility is low and there are temporal changes. Therefore, when each of the members thermally expands, the measurement error of the stereo camera may disadvantageously increase with deformation occurring in each of the members that changes with time with low reproducibility.

The present invention has been made in view of the above problems, and it is an object of the present invention to provide a stereo camera capable of reducing the measurement error by alleviating thermal stress generated between members.

Solution to Problem

In order to achieve the above object, a stereo camera of the present invention includes: a pair of camera modules; a circuit board connected to the pair of camera modules; and a housing supporting the circuit board and the pair of camera modules, in which the housing includes: a high-rigidity support part and a low-rigidity support part for supporting the circuit board; a high-rigidity support area having the high-rigidity support part; and a low-rigidity support area having the low-rigidity support part, the high-rigidity support part has higher rigidity against force acting in a baseline direction along a baseline length of the pair of camera modules than that of the low-rigidity support part, and the high-rigidity support area is included at one location adjacent to the low-rigidity support area in the baseline direction.

Advantageous Effects of Invention

According to the stereo camera of the present invention, the circuit board is supported by the high-rigidity support part in the high-rigidity support area included at one location of the housing and is supported by the low-rigidity support part in the low-rigidity support area adjacent to the high-rigidity support area of the housing in the baseline direction along the baseline length of the pair of camera modules. Therefore, when thermal stress in the baseline direction acts between the circuit board and the housing due to a temperature change, the low-rigidity support part having lower rigidity than the high-rigidity support part is elastically deformed in the baseline direction to alleviate the thermal stress. This suppresses deformation of the housing supporting the pair of camera modules, thereby allowing the measurement error by the pair of camera modules to be reduced.

DESCRIPTION OF EMBODIMENTS

An embodiment of a stereo camera of the present invention will be described below with reference to the drawings.

First Embodiment

Figure 1:
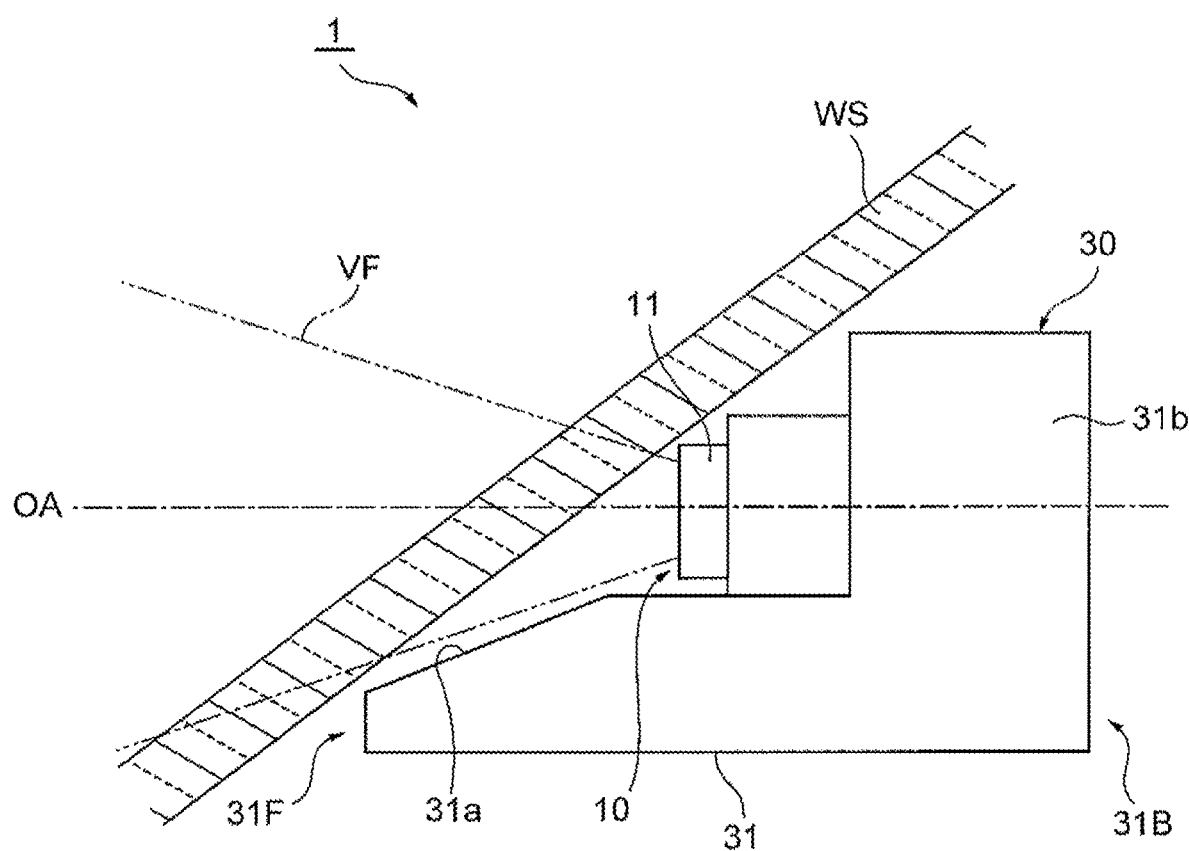
FIG. 1 is a side view illustrating an installed state of a stereo camera according to a first embodiment of the present invention.
Figure 1:
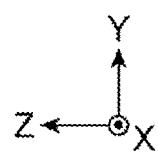

FIG. 1 is a side view illustrating an installed state of a stereo camera 1 according to a first embodiment of the present invention. The stereo camera 1 of the present embodiment is a device which is installed in front of a windshield WS of a vehicle such as an automobile facing ahead in a traveling direction and captures images of roads, preceding vehicles, oncoming vehicles, pedestrians, obstacles, etc., and measures the distance to or the relative speed with respect to a subject, etc.

Figure 2A:
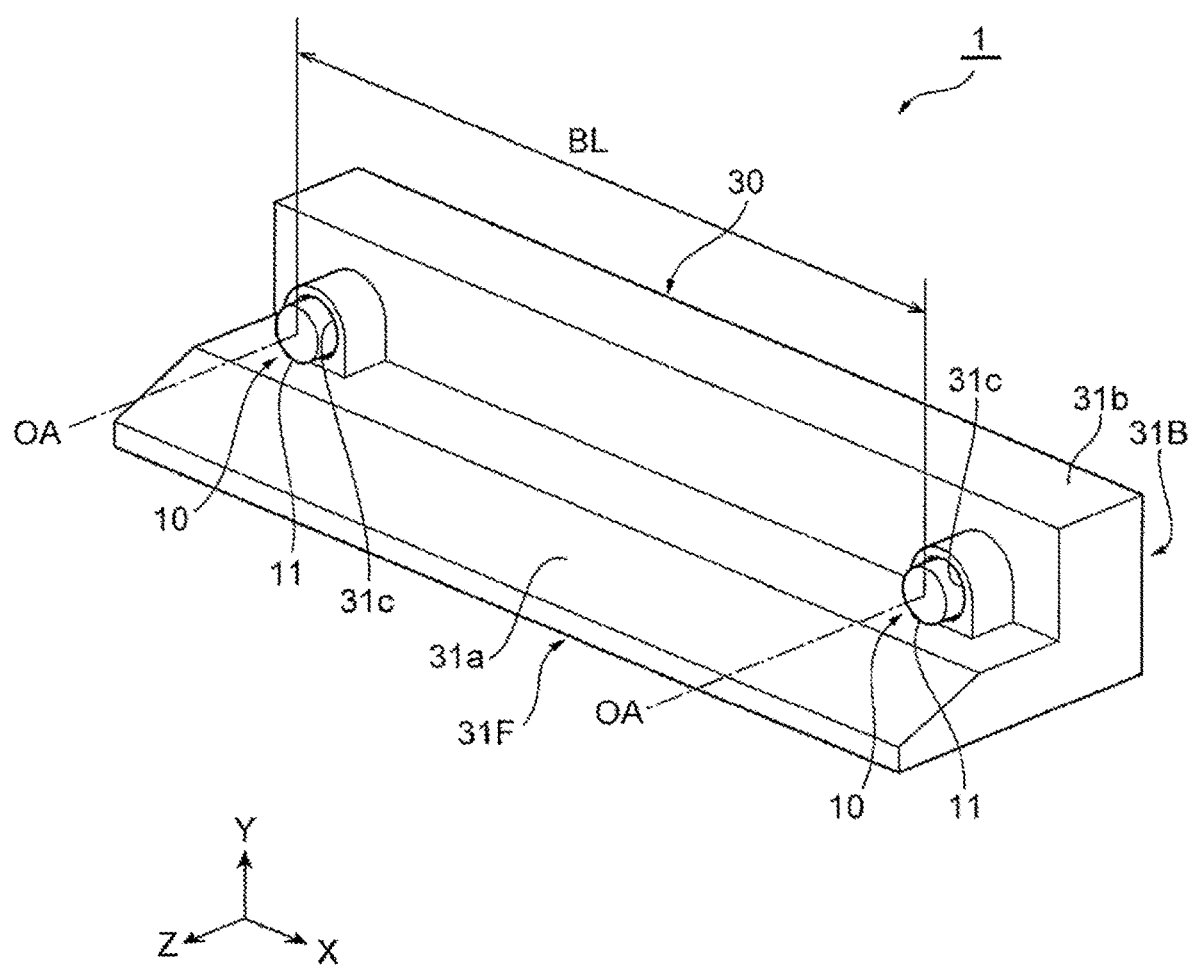
FIG. 2A is a perspective view of a top surface side of the stereo camera illustrated in FIG. 1.
Figure 2B:
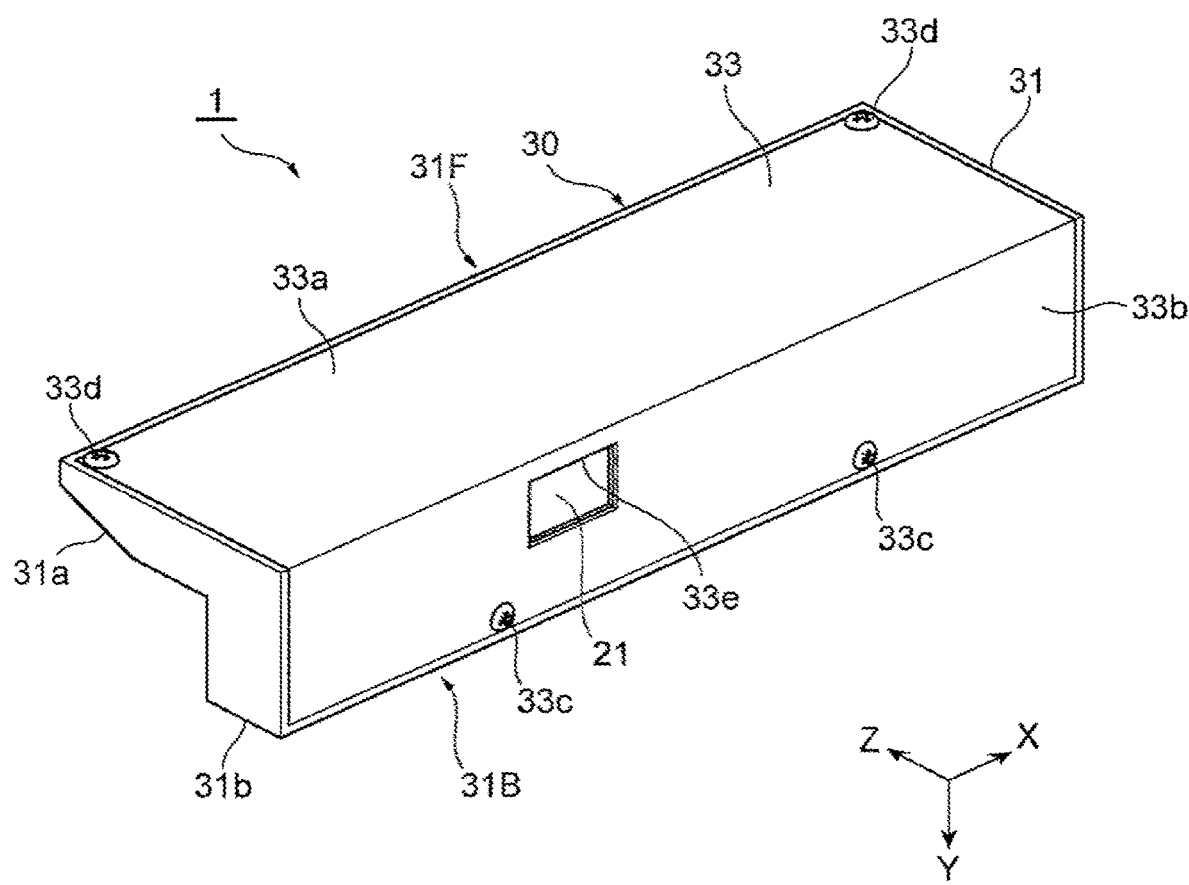
FIG. 2B is a perspective view of a bottom surface side of the stereo camera illustrated in FIG. 1.
Figure 3:
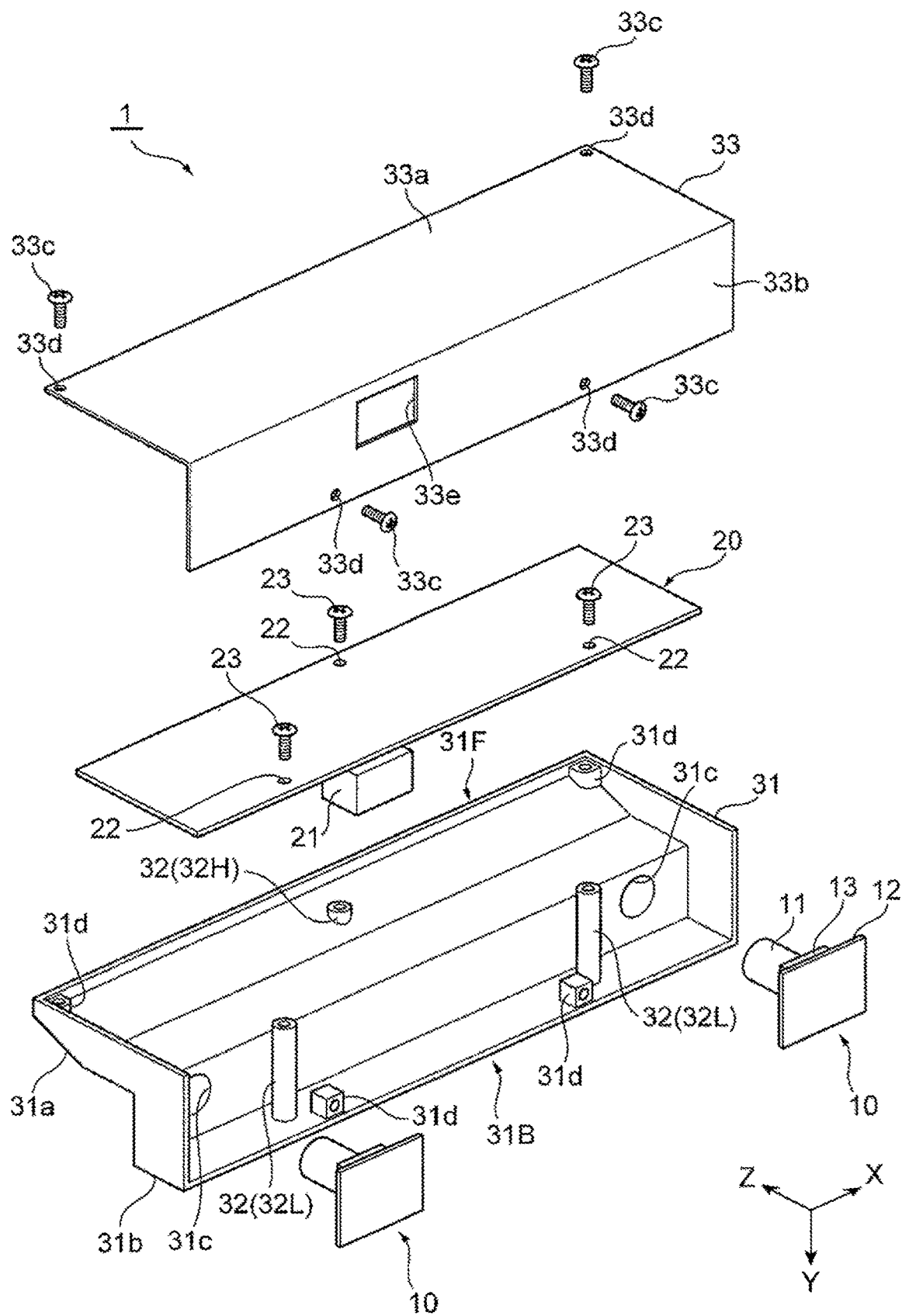
FIG. 3 is an exploded perspective view of the stereo camera illustrated in FIG. 2B.

FIG. 2A is a perspective view of a top surface side of the stereo camera 1 illustrated in FIG. 1. FIG. 2B is a perspective view of a bottom surface side of the stereo camera 1 illustrated in FIG. 1. FIG. 3 is an exploded perspective view of the stereo camera 1 illustrated in FIG. 2B. The stereo camera 1 of the present embodiment includes a pair of camera modules 10, a circuit board 20 connected to the pair of camera modules 10, and a housing 30 supporting the circuit board 20 and the pair of camera modules 10.

Figure 4:
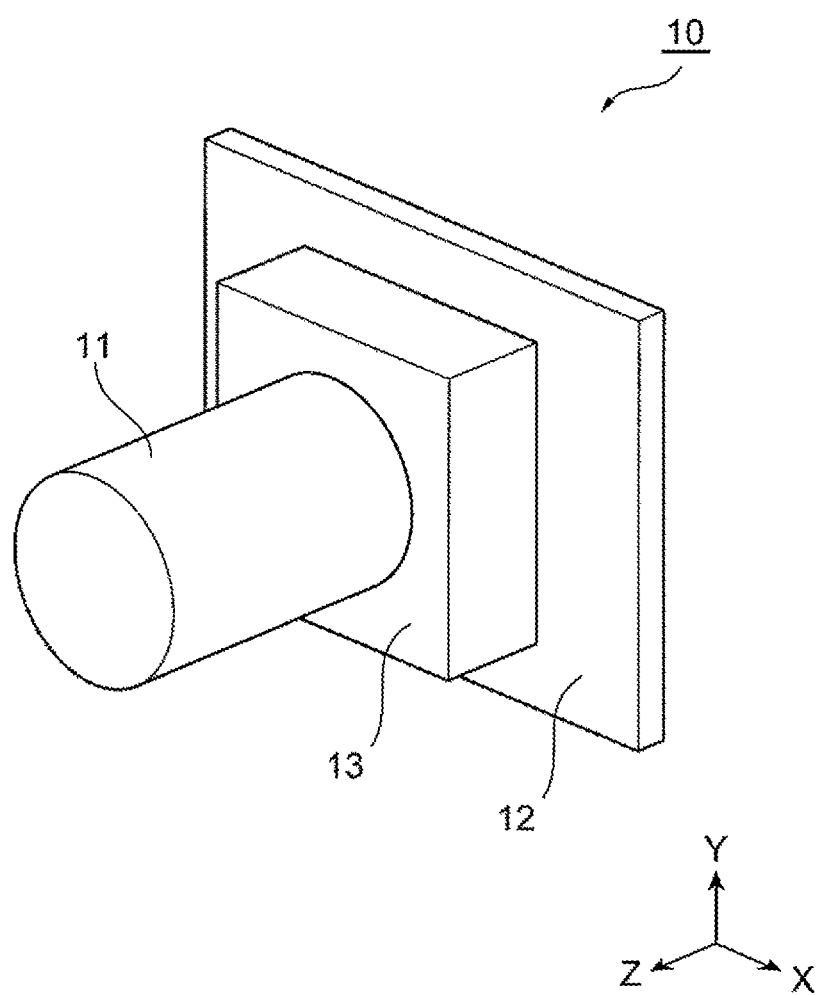
FIG. 4 is a perspective view of a camera module illustrated in FIG. 3.

FIG. 4 is a perspective view of a camera module 10 illustrated in FIG. 3. The camera module 10 includes a cylindrical lens 11 and a sensor substrate 12. The lens 11 is fixed to the sensor substrate 12 via a flange part 13. The sensor substrate 12 has an image sensor (not illustrated), and the position thereof with respect to the lens 11 is adjusted such that an image having passed through the lens 11 is appropriately formed into the image at the center of the image sensor.

When the stereo camera 1 is installed as illustrated in FIG. 1, the camera module 10 is arranged close to the inclined windshield WS and can capture an image of an object present in the field of view VF ahead the vehicle. Note that, in each of the drawings, an orthogonal coordinate system is illustrated in which a direction connecting the pair of camera modules 10, that is, a baseline direction along a baseline length BL which is the distance between the optical axes OA, is regarded as an X axis direction, the optical axis OA direction of the pair of camera modules 10 is regarded as a Z axis direction, and a direction perpendicular to the X axis direction and the Z axis direction is regarded as a Y axis direction.

The circuit board 20 is made of, for example, a glass epoxy base material, a ceramic base material, or the like. Although not illustrated, the circuit board 20 includes a signal processing circuit electrically connected to the sensor substrates 12 of the camera modules 10 by flexible wiring. On the rear side of the circuit board 20, a connector 21 connected to the signal processing circuit is installed. The connector 21 of the circuit board 20 is connected to, for example, a connector of wiring connected to a vehicle control device (not illustrated). This allows the stereo camera 1 and the vehicle control device to be electrically connected.

The circuit board 20 has a substantially rectangular shape in which the X axis direction which is the baseline direction is the longitudinal direction and the Z axis direction which is the optical axis OA direction of the camera modules 10 is the lateral direction. The circuit board 20 has a plurality of through holes 22 through which fastening members such as screws 23 are inserted. The through holes 22 of the circuit board 20 are included at positions corresponding to screw holes included in board support parts 32 which will be described later.

The housing 30 has, for example, a main body 31, the board support parts 32, and a cover 33. From the viewpoint of reducing the difference in deformation amount due to temperature changes and suppressing deformation, it is preferable that the material of the main body 31 and the material of the cover 33 have the same linear expansion coefficient or have as small a difference as possible in the linear expansion coefficient. The material of the housing 30 is not particularly limited, and a metal material such as an aluminum alloy may be used, for example.

The main body 31 has a substantially L-shape in a side view when viewed from the X axis direction and the height dimension gradually decreasing from the rear side to the front side of the vehicle in accordance with the inclination of the windshield WS.

More specifically, the main body 31 has a front end 31F and a rear end 31B in the direction of the optical axis OA of the camera modules 10. The front end 31F has a smaller height dimension in the height direction (Y axis direction) perpendicular to the baseline direction (X axis direction) and the optical axis OA direction (Z axis direction) than that of the rear end 31B. Moreover, the front end 31F has an inclined part 31a which is inclined with respect to the Z axis direction to face the windshield WS. As illustrated in FIG. 3, the main body 31 has a lower end and a rear end opened and has a space for accommodating the pair of camera modules 10 and the circuit board 20.

The main body 31 has a camera support part 31b having a substantially rectangular box shape with a large height at the rear end 31B. The camera support part 31b is capable of supporting the pair of camera modules 10 by, for example, allowing the lenses 11 of the pair of camera modules 10 to pass through a pair of circular openings 31c included in a front wall part facing ahead of the vehicle and supporting the sensor substrates 12 of the camera modules 10 by side wall parts and an upper wall part. Alternatively, the camera support part 31b may support the flange parts 13 of the camera modules 10 with the front wall part. The main body 31 in capable of stably hold the pair of camera modules 10 the direction of the optical axis OA of which is precisely adjusted.

The main body 31 has cover fixing parts 31d for fixing the cover 33. The cover fixing parts 31d are, for example, each formed into a protruding shape having an end surface on which a screw hole is formed.

The main body 31 may have a pair of cover fixing parts 31d screw holes of which face downward (Y axis negative direction) at both ends in the baseline direction (X axis direction) inside the front end 31F and a pair of cover fixing parts 31d screw holes of which face the rear side of the vehicle (Z axis negative direction) on the upper wall part of the camera support part 31b inside the rear end 31B. The pair of cover fixing parts 31d included on the upper wall part of the camera support part 31b can be arranged close to the camera modules 10 between the pair of camera modules 10 while spaced apart in the baseline direction.

The cover 33 has a bottom wall part 33a which closes the lower end of the main body 31 and a rear wall part 33b which closes the rear end of the main body 31 and has an L-letter shape in a side view when viewed from the X axis direction, which is the baseline direction. The bottom wall part 33a has through holes 33d, through which screws 33c for fixing the cover 33 are to be inserted, at positions corresponding to the screw holes of the cover fixing parts 31d of the main body 31 at both ends of the front end in the X axis direction. The rear wall part 33b has through holes 33d, through which screws 33c for fixing the cover 33 are to be inserted, at positions corresponding to the screw holes of the cover fixing parts 31d of the main body 31, the positions on an inner side with respect to both ends of an upper end in the X axis direction. In addition, the rear wall part 33b has an opening 33e that enables connection with another connector to the connector 21 at a position corresponding to the connector 21 of the circuit board 20.

The board support parts 32 are integrally formed with the main body 31 and is provided as a part of the main body 31, for example. A total of three board support parts 32 are provided while spaced apart from each other with one included inside the front end 31F of the main body 31 of the housing 30 and the other two included on an inner side with respect to the camera support parts 31b of the rear end 31B of the main body 31.

The board support part 32 provided on the front end 31F of the main body 31 of the housing 30 is included in the central part of the main body 31 in the baseline direction (X axis direction). The two board support parts 32 provided at the rear end 31B of the main body 31 of the housing 30 are arranged on the same linear line parallel to the X axis direction and are arranged at equal distances from the one board support part 32 provided at the front end 31F of the main body 31. Moreover, the board support parts 32 are arranged on an inner side between the pair of camera modules 10 in the baseline direction.

Figure 5:
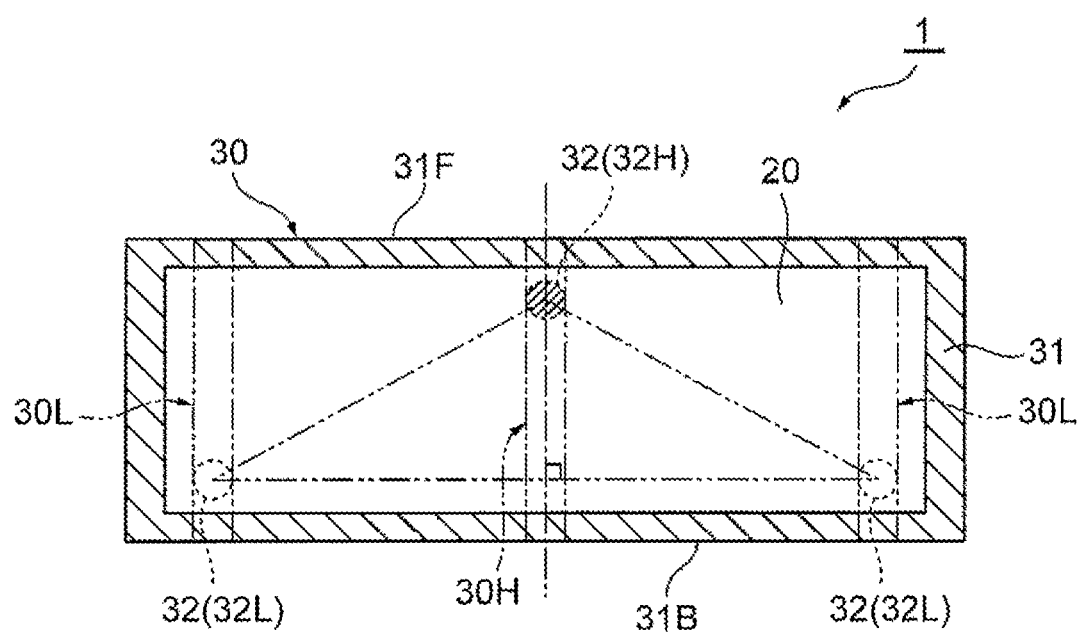
FIG. 5 is a plan cross-sectional view illustrating the arrangement of board support parts illustrated in FIG. 3.

FIG. 5 is a plan cross-sectional view illustrating the arrangement of the board support parts 32 illustrated in FIG. 3. In the stereo camera 1 of the present embodiment, the three board support parts 32 are arranged at apexes of an isosceles triangle.

Moreover, the perpendicular bisector of the base of the isosceles triangle defined by the three board support parts 32 is parallel to the Z axis direction which is the direction of the optical axis OA of the pair of camera modules 10.

The rigidity of the board support parts 32 against the force in the baseline direction (X axis direction) along the baseline length BL of the pair of camera modules is lower than that of the main body 31. Here, the rigidity of the board support parts 32 means how unlikely the force in the baseline direction to cause deformation thereof, and the rigidity of the main body 31 means how unlikely the force in the baseline direction which the main body 31 receives from the board support parts 32 to cause deformation thereof. A comparison between the rigidity of the board support parts 32 and the rigidity of the main body 31 can be performed, for example, as follows.

First, assuming that the board support parts 32 are rigid bodies and that the main body 31 is an elastic body. Then, calculate the deflection occurring in the main body 31 by the force in the baseline direction acting on the main body 31 generated by a difference in linear expansion coefficients of the circuit board 20 and the main body 31. Next, assuming that the main body 31 is a rigid body and that the board support parts 32 are elastic bodies. Then, calculate the deflection occurring in the board support parts 32 by the force in the baseline direction acting on the board support parts 32 generated by a difference in linear expansion coefficients of the circuit board 20 and the main body 31.

By comparing the deflection of the main body 31 and the deflection of the board support parts 32 calculated as described above, the rigidity of the main body 31 and the rigidity of the board support part 32 can be compared to each other. That is, in the case where the calculated deflection of the main body 31 is smaller than the deflection of the board support parts 32, it can be understood that the rigidity of the main body 31 is higher than the rigidity of the board support parts 32.

Note that the method for setting the rigidity of the board support parts 32 lower than the rigidity of the main body 31 is not limited to the method determined on the basis of the above comparison. For example, by making the board support parts 32 liable to elastic deformation as much as possible as long as sufficient durability against vibration and shock is achieved and improving the rigidity of the main body 31 as much as possible within a range allowed by restrictions of specifications, the rigidity of the board support parts 32 can be lower than the rigidity of the main body 31.

The board support parts 32 may include a high-rigidity support part 32H and low-rigidity support parts 32L.

That is, the housing 30 is provided with the high-rigidity support part 32H and the low-rigidity support parts 32L for supporting the circuit board 20, a high-rigidity support area 30H having the high-rigidity support part 32H, and low-rigidity support areas 30L having the low-rigidity support parts 32L. Note that, in FIG. 5, in order to facilitate distinguishing between the high-rigidity support part 32H and the low-rigidity support parts 32L, the high-rigidity support part 32H is hatched. The high-rigidity support part 32H has greater rigidity against force acting in the baseline direction (X axis direction) along the baseline length BL than that of the low-rigidity support parts 32L.

In the example illustrated in FIG. 5, one board support part 32 provided on the front end 31F of the housing 30 is the high-rigidity support part 32H, and two board support parts 32 provided on the rear end 31B of the housing 30 are the low-rigidity support parts 32L. That is, in the stereo camera 1 of the present embodiment, the housing 30 has one high-rigidity support part 32H and two low-rigidity support parts 32L arranged to define an isosceles triangle having a base parallel to the baseline direction (X axis direction). The high-rigidity support part 32H is arranged at the apex of the vertical angle of the isosceles triangle on the front side of the vehicle, and the low-rigidity support parts 32L are arranged at the apexes of the base angles of the isosceles triangle on the rear side of the vehicle.

In the stereo camera 1 of the present embodiment, the high-rigidity support area 30H of the housing 30 is included at one location adjacent to the low-rigidity support areas 30L in the baseline direction (X axis direction). More specifically, the low-rigidity support areas 30L are included at both ends in the baseline direction, and the high-rigidity support area 30H is included between the low-rigidity support areas 30L in the baseline direction. Moreover, the high-rigidity support area 30H at the central part of the housing 30 has one high-rigidity support part 32H, and the low-rigidity support areas 30L at the both ends of the housing 30 each has one low-rigidity support part 32L.

In the stereo camera 1 of the present embodiment, as illustrated in FIG. 3, the high-rigidity support part 32H and the low-rigidity support part 32L are provided as in a cylindrical shape in which the height direction (Y axis direction) is the axial direction. More specifically, the high-rigidity support part 32H is provided at the front end 31F of the main body 31 of the housing 30, and the low-rigidity support parts 32L are provided at the rear end 31B of the main body 31. Each of the high-rigidity support part 32H and the low-rigidity support parts 32L is formed in a columnar shape in which the height direction is the axial direction.

The axial height dimension of the high-rigidity support part 32H is smaller than the axial height dimension of the low-rigidity support part 32L. The diameters of the high-rigidity support part 32H and the low-rigidity support part 32L are substantially equal. In this manner, in a columnar board support part 32 extending in the axial direction and having substantially the same cross-sectional area, increasing the axial height dimension can reduce the rigidity in the baseline direction (X axis direction), and lowering the axial height dimension can improve the rigidity in the baseline direction.

Note that, in the case where the rigidity of the low-rigidity support parts 32L is lower than the rigidity of the main body 31 against the force in the baseline direction (X axis direction), the rigidity of the high-rigidity support part 32H may be higher than the rigidity of the main body 31. That is, in the case of a plurality of board support parts 32, it suffices that the rigidity of at least one board support part 32 is lower than the rigidity of the main body 31 against the force in the baseline direction. The screw holes for fastening screws for fixing the circuit board 20 are included on tip end surfaces of the high-rigidity support part 32H and the low-rigidity support parts 32L.

In the stereo camera 1 of the present embodiment, as illustrated in FIG. 3, the low-rigidity support parts 32L and the high-rigidity support part 32H are arranged on the inner side between the pair of camera modules 10 in the baseline direction (X axis direction).

The stereo camera 1 can be assembled, for example, by the following procedure. First, as illustrated in FIG. 3, the cylindrical lenses 11 of the pair of camera modules 10 are inserted from the inside of the pair of circular openings 31c of the main body 31 of the housing 30. Then, the optical axes OA of the pair of camera modules 10 are precisely adjusted, and the pair of camera modules 10 is fixed to the camera support part 31b of the main body 31. As a result, the pair of camera modules 10 is supported by the main body 31 of the housing 30.

Next, the through holes 22 of the circuit board 20 are aligned with the screw holes of the high-rigidity support part 32H and the low-rigidity support parts 32L to allow the screws 23 inserted through the through holes 22 of the circuit board 20 to be fastened to the screw holes of the high-rigidity support part 32H and the low-rigidity support parts 32L. As a result, the circuit board 20 is supported by the board support parts 32 of the housing 30, that is, the high-rigidity support part 32H and the low-rigidity support parts 32L.

Finally, the lower end and the rear end of the main body 31 are closed by the bottom wall part 33a and the rear wall part 33b of the cover 33, and the through holes 33d of the cover 33 are aligned with the screw holes of the cover fixing parts 31d of the main body 31 to allow the screws 33c inserted through the through holes 33d of the cover 33 to be fastened to the screw holes of the cover fixing parts 31d.

As a result, assembling of the stereo camera 1 including the pair of camera modules 10, the circuit board connected to the pair of camera modules 10, and the housing 30 supporting the circuit board 20 and the pair of camera modules 10 is completed. Thereafter, the stereo camera 1 can be installed in a vehicle for example via the windshield WS of a vehicle as illustrated in FIG. 1 or via a bracket (not illustrated) fixed to a ceiling of a vehicle, etc.

Hereinafter, the operation of the stereo camera 1 of the present embodiment will be described.

As described above, the stereo camera 1 of the present embodiment includes the pair of camera modules 10, the circuit board 20 connected to the pair of camera modules 10, and the housing 30 supporting the circuit board and the pair of camera modules 10. Therefore, it is enabled to capture an image of a measurement object such as a road ahead the vehicle, a preceding vehicle, an oncoming vehicle, a pedestrian, or an obstacle by the pair of camera modules 10 and to obtain the parallax of the measurement object from the images of the pair of camera modules 10 to obtain the distance to the measurement object.

For example, when the temperature of the stereo camera 1 changes due to sunshine or other reasons, force generated by a difference in the deformation amount due to the temperature change acts between the housing 30 and the circuit board 20 having different linear expansion coefficients. More specifically, for example, in the case where the material of the housing 30 is an aluminum alloy, the linear expansion coefficient of the housing 30 is about $23 \times 10^{-6}/^\circ$ C. Meanwhile, in the case where the base material of the circuit board 20 is a glass epoxy base material, the linear expansion coefficient of the circuit board 20 is about $15 \times 10^{-6}/^\circ$ C. In this case, when the temperature of the stereo camera 1 rises, the amount of thermal expansion of the housing 30 becomes larger than the amount of thermal expansion of the circuit board 20.

Generally, as the baseline length BL, which is the distance between the optical axes OA of the pair of camera modules 10, is longer, the measurement accuracy of the distance of the stereo camera 1 is improved. Therefore, the housing 30 of the stereo camera 1 has an elongated shape having a longitudinal direction in the baseline direction (X axis direction) along the baseline length BL, and in many cases the pair of camera modules 10 is installed to both ends in the baseline direction. In this case, for example, if the peripheral part of the circuit board 20 is firmly fixed to the housing 30, the thermal expansion in the baseline direction of the housing 30 is restricted by the circuit board 20 having a small amount of thermal expansion, and such force that pulls the both ends of the housing 30 toward the central part in the baseline direction is applied thereto. When such force acts on the housing 30, deformation such as deflection or warping occurs in the housing 30, and the relative positional relationship between the pair of camera modules 10 changes to generate a parallax error, which may disadvantageously result in an increase in the measurement error of distance by the stereo camera 1.

Here, in the stereo camera 1 of the present embodiment, the housing 30 has the main body 31 that supports the pair of camera modules 10 and the board support parts 32 that support the circuit board 20. The low-rigidity support parts 32L as the board support parts 32 have lower rigidity against the force in the baseline direction along the baseline length BL of the pair of camera modules 10 than that of the main body 31. Therefore, the low-rigidity support parts 32L supporting the circuit board 20 is elastically deformed more easily than the main body 31 to absorb the difference in the thermal expansion amount between the housing 30 and the circuit board 20 and to relieve the stress acting on the main body 31, thereby enabling to suppress deflection or warping of the main body 31.

More specifically, the housing 30 includes the high-rigidity support part 32H and the low-rigidity support parts 32L for supporting the circuit board 20, the high-rigidity support area 30H having the high-rigidity support part 32H, and the low-rigidity support areas 30L having the low-rigidity support parts 32L. The high-rigidity support part 32H has greater rigidity against force acting in the baseline direction along the baseline length BL of the pair of camera modules 10 than that of the low-rigidity support parts 32L. The high-rigidity support area 30H is included at one location so as to be adjacent to the low-rigidity support areas 30L in the baseline direction.

As a result, it is enabled to firmly and stably support the circuit board 20 by the high-rigidity support part 32H provided at the one high-rigidity support area 30H adjacent to the low-rigidity support areas 30L in the baseline direction (X axis direction). Furthermore, the low-rigidity support parts 32L provided at the low-rigidity support areas 30L adjacent to the high-rigidity support area 30H in the baseline direction are allowed to be elastically deformed more easily than the high-rigidity support part 32H.

That is, while the circuit board 20 is stably and firmly supported in the high-rigidity support area 30H provided at one location of the housing 30, it is enabled to absorb the difference in the thermal expansion amount between the housing 30 and the circuit board 20 by the elastic deformation of the low-rigidity support parts 32L to suppress deflection or warping of the main body 31. Therefore, according to the stereo camera 1 of the present embodiment, a relative displacement between the pair of camera modules 10 can be suppressed, an error in the parallax between the pair of camera modules 10 can be reduced, and a distance to a measurement object can be obtained more accurately.

On the other hand, in the case where the circuit board is arranged between the first frame member and the second frame member as in the conventional camera system, excessive force generated by a difference in the thermal expansion amounts of the circuit board and the frame members may act on the connecting portions connecting the circuit board and the frame members.

Also, in the conventional camera system, the circuit board has two horizontally extending slots and one vertically extending slot, and each of the slots allows a part of the circuit board local to the slot to move relative to the frame within a range of the slot. This allows the stresses to be relieved when the camera system is exposed to extreme temperatures. Each of the slots accommodates a fixing member slidably connecting the circuit board and the frame.

However, the ease of relative movement between the circuit board and the frame in the conventional camera system varies depending on the fastening force by the fixing member and the frictional force between the members, and thus reproducibility is low and there are temporal changes. Therefore, when each of the members thermally expands, the measurement error of the stereo camera may disadvantageously increase with deformation occurring in each of the members that changes with time with low reproducibility.

More specifically, in the conventional camera system, when the sliding amount between the circuit board and the frame varies, the shape of the entire camera system after thermal deformation also varies, resulting in lower reproducibility of the parallax error. Moreover, in order to fix the circuit board and the frame while maintaining good sliding property such that there is no variation in the shape after thermal deformation of the entire camera system, it is extremely difficult to adjust the fastening force, and there is a concern that the fastening portion may be loosened due to vibrations. Furthermore, in the conventional camera system, in the case where the rigidity of the frame is increased to implement a robust structure so as to prevent deformation of the frame, the force acting on the fastening portion between the frame and the circuit board may increase, and sliding may occur even when the fastening force is increased, which may disadvantageously change the shape of the camera system after thermal deformation.

On the other hand, in the stereo camera 1 of the present embodiment, as described above, the thermal stress is alleviated by elastic deformation of the board support parts 32 having lower rigidity against the force in the baseline direction (X axis direction) along the baseline length BL of the pair of camera modules 10 than that of the main body 31, that is, the low-rigidity support parts 32L. Therefore, even when slight deformation occurs in the main body 31 due to the thermal stress after alleviation by the low-rigidity support parts 32L, the deformation has good reproducibility.

Therefore, according to the stereo camera 1 of the present embodiment, the deformation of the main body 31 can be predicted with a good accuracy, and the parallax error can be corrected with high accuracy by image correction or the like between the pair of camera modules 10. In addition, since no deformation occurs that changes over time, it is possible to eliminate the concern that the measurement error of the stereo camera 1 increases.

Furthermore, in the stereo camera 1 of the present embodiment, the low-rigidity support areas 30L are included at both ends in the baseline direction (X axis direction), and the high-rigidity support area 30H is included between the low-rigidity support areas 30L in the baseline direction.

With this configuration, it is possible to reduce the distance between the high-rigidity support part 32H and the low-rigidity support parts 32L and to reduce the amount of elastic deformation of the low-rigidity support parts 32L as compared with the case where the low-rigidity support area 30L and the high-rigidity support area 30H are included at one end and the other end in the baseline direction, respectively. Therefore, it is possible to alleviate the thermal stress by the low-rigidity support parts 32L more easily. This further reduces the deformation of the main body 31 of the housing 30, further reduces the parallax error between the pair of camera modules 10, thereby enabling obtaining a distance to the measurement object more accurately.

In addition, with the above configuration, both sides of the middle part of the circuit board 20 supported by the high-rigidity support part 32H are supported by the low-rigidity support parts 32L. Therefore, in the circuit board 20, the middle part in the baseline direction is stably and firmly held by the high-rigidity support part 32H, and deformation from the middle part to the both ends in the baseline direction is accommodated by the elastic deformation of the low-rigidity support parts 32L.

As a result, it is possible to support the middle part and the both ends of the circuit board 20 in a well-balanced manner to stabilize the deformation.

In particular, as illustrated in FIG. 5, by arranging one high-rigidity support part 32H and two low-rigidity support parts 32L at apexes of an isosceles triangle the base of which is parallel to the baseline direction, the middle part and the both ends in the baseline direction of the circuit board 20 can be supported in a more balanced manner at the three points, thereby further stabilizing the deformation.

As illustrated in FIG. 1, the windshield WS of a general vehicle is often inclined with respect to the vertical direction such that the lower side thereof is located on the front side of the vehicle than the upper side thereof. Therefore, by making the height dimension of the front end 31F of the main body 31 smaller than the height dimension of the rear end 31B, the stereo camera 1 can be arranged compactly in the vicinity of the windshield WS. In addition, since the main body 31 has a substantially L-shape in a side view, the housing 30 can be efficiently arranged in a limited space while the camera module 10 is brought close to the windshield WS.

Moreover, since the front end 31F of the main body 31 of the housing 30 has the inclined part 31a inclined like the windshield WS is, it is enabled to prevent interference between the housing 30 and the windshield WS and to secure the field of view VF of the camera module 10 with the camera module 10 brought close to the windshield WS.

Moreover, in the case where the height dimension of the front end 31F of the main body 31 of the housing 30 is smaller than the height dimension of the rear end 31B, as illustrated in FIG. 3, the board support part 32 provided on the front end 31F of the main body 31 may be the high-rigidity support part 32H and the board support parts 32 provided on the rear end 31B of the main body 31 may be the low-rigidity support parts 32L. That is, the high-rigidity support part 32H is provided on the front end 31F of the main body 31, and the low-rigidity support parts 32L are provided on the rear end 31B of the main body 31. The high-rigidity support part 32H and the low-rigidity support parts 32L are formed into a columnar shape in which the height direction is the axial direction.

This enables efficiently arranging the high-rigidity support part 32H, which has a relatively small axial height dimension, in a space having a relatively small height dimension in the inner side of the front end 31F of the main body 31 of the housing 30. In addition, the high-rigidity support parts 32H having a relatively large axial height dimension can be efficiently arranged in a space having a relatively large height dimension in the inner side of the rear end 31B of the main body 31. As a result, the stereo camera 1 can be downsized.

Furthermore, in the stereo camera 1 of the present embodiment, each high-rigidity support area 30H has one high-rigidity support part 32H. This prevents deformation of the circuit board 20 due to a temperature change from being disturbed by the high-rigidity support parts 32H, thereby enabling more effectively suppressing deformation of the main body 31. More specifically, in the case of providing two or more high-rigidity support parts 32H, the effect of alleviating the thermal stress by allowing deformation of the circuit board 20 is reduced between the high-rigidity support parts 32H. Therefore, by providing only one high-rigidity support part 32H, it is possible to prevent the high-rigidity support part 32H from disturbing deformation of the circuit board 20 due to a temperature change and to more effectively suppress deformation of the main body 31.

In the stereo camera 1 of the present embodiment, all the board support parts 32, that is, the low-rigidity support parts 32L and the high-rigidity support part 32H are arranged on the inner side between the pair of camera modules 10 in the baseline direction (X axis direction). This allows the baseline length BL of the pair of camera modules 10 to be longer, thereby improving the distance measurement accuracy of the stereo camera 1.

As described above, according to the stereo camera 1 of the present embodiment, the thermal stress generated between the circuit board 20 and the housing 30 is relieved, thereby suppressing deformation of the main body 31 of the housing 30 supporting the camera module 10 and reducing the measurement error of the distance to a measurement object.

Note that in the stereo camera 1 of the present embodiment, the arrangement of the board support parts 32 is not limited to the above-described arrangement of an isosceles triangle. Moreover, the structure of the low-rigidity support parts 32L is not limited to the columnar structure described above. Hereinafter, first to eighth variations of the arrangement of the board support parts 32 illustrated in FIG. 5 will be described with reference to FIGS. 6A to 6H. A ninth variation of the low-rigidity support parts 32L will be described with reference to FIG. 7. FIGS. 6A to 6H are plan cross-sectional views illustrating the first to eighth variations corresponding to the arrangement of the board support parts 32 in FIG. 5.

(First Variation)

Figure 6A:
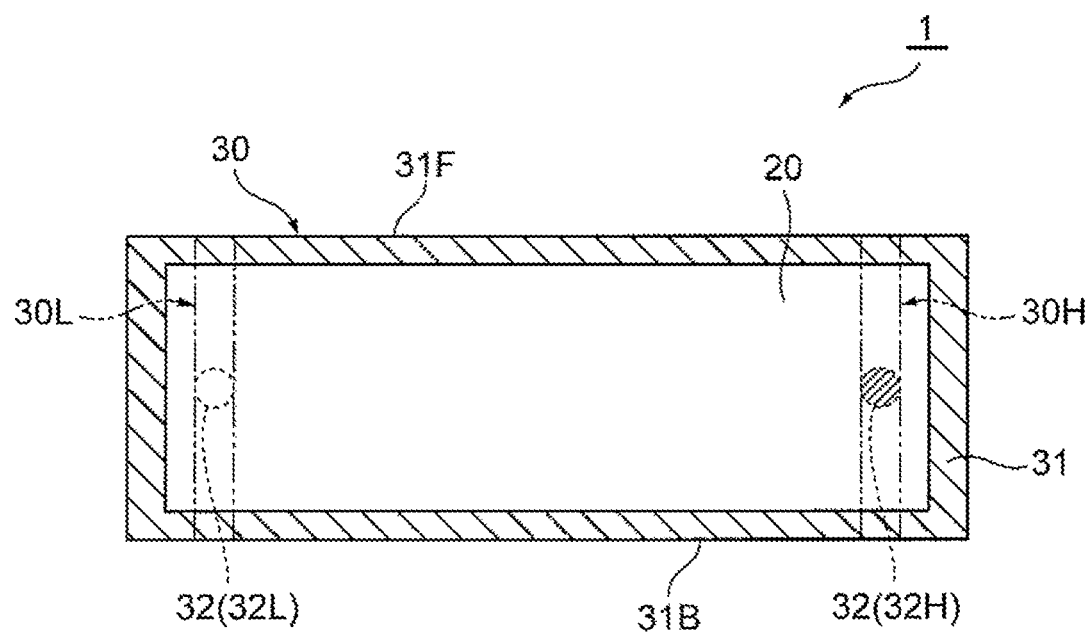
FIG. 6A is a plan cross-sectional view illustrating a first variation of the arrangement of the board support parts illustrated in FIG. 5.

A stereo camera 1 of the first variation illustrated in FIG. 6A has board support parts 32 at one end and the other end of a housing 30 in the baseline direction (X axis direction). More specifically, the housing 30 has one high-rigidity support area 30H at one end in the baseline direction and one low-rigidity support area 30L at the other end in the baseline direction. The high-rigidity support area 30H has one high-rigidity support part 32H, and the low-rigidity support area 30L has one low-rigidity support part 32L. The high-rigidity support part H and the low-rigidity support part 32L may be arranged so as to support the central part of the circuit board 20 in the direction of the optical axis OA (Z axis direction) of the camera modules 10, for example.

According to the arrangement of the low-rigidity support part 32L and the high-rigidity support part H illustrated in FIG. 6A, the circuit board 20 can be stably and firmly supported by the high-rigidity support part 32H at one end in the baseline direction of the housing 30. Also, by elastically deforming the low-rigidity support part 32L at the other end in the baseline direction of the housing 30, deformation in the baseline direction of the circuit board 20 is allowed, and the force acting in the baseline direction of the main body 31 of the housing 30 can be relieved. Therefore, also in the stereo camera 1 of the first variation illustrated in FIG. 6A, similar effects to those of the stereo camera 1 described in the above embodiment can be obtained.

(Second Variation)

Figure 6B:
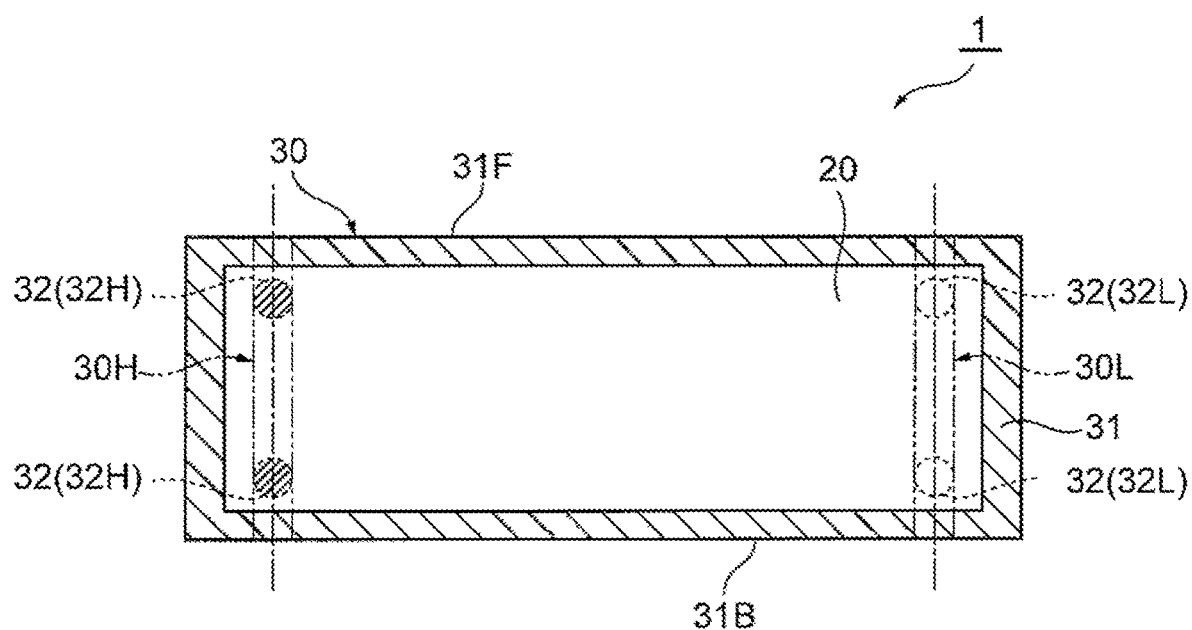
FIG. 6B is a plan cross-sectional view illustrating a second variation of the arrangement of the board support parts illustrated in FIG. 5.
Figure 6B:
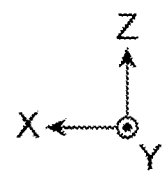

A stereo camera 1 of a second variation illustrated in FIG. 6B has one high-rigidity support area 30H at one end in the baseline direction and one low-rigidity support area 30L at the other end in the baseline direction like in the first variation. In the second variation, however, unlike the first variation the high-rigidity support area 30H has two high-rigidity support parts 32H, and the low-rigidity support area 30L has two low-rigidity support parts 32L.

Each of the two high-rigidity support parts 32H and the two low-rigidity support parts 32L may be arranged so as to support one end and the other end, respectively, of a circuit board 20 in the optical axis OA direction (Z axis direction) of camera modules 10. Moreover, each of the two high-rigidity support parts 32H and the two low-rigidity support parts 32L may be arranged on a linear line parallel to the direction of the optical axis OA. That is, the high-rigidity support area 30H has a plurality of high-rigidity support parts 32H arranged while aligned in the direction of the optical axis OA intersecting the baseline direction (X axis direction).

According to the arrangement of the low-rigidity support parts 32L and the high-rigidity support parts 32H illustrated in FIG. 6B, it is possible to support four points of the circuit board 20. Therefore, when vibration or shock acts on the stereo camera 1, the circuit board 20 can be more firmly and stably supported, thereby enabling to further reduce vibration of the circuit board 20. In this case, by arranging the two high-rigidity support parts 32H on a linear line parallel to the direction of the optical axis OA in a direction intersecting the baseline direction (X axis direction), it is possible to prevent the two high-rigidity support parts 32H from disturbing deformation of the circuit board 20 in the baseline direction.

This can effectively reduce the thermal stress acting in the baseline direction, which is greatly affected by the parallax error. Note that deformation of the circuit board 20 in the direction of the optical axis OA is disturbed by the two high-rigidity support parts 32H, and thermal stress acting in the direction of the optical axis OA acts on the main body 31. However, the thermal stress acting in the direction of the optical axis OA has less influence on the deformation of the main body 31 as compared with the thermal stress acting in the baseline direction, and influence on the parallax error is very small, and thus in most cases this does not pose a problem.

(Third Variation)

Figure 6C:
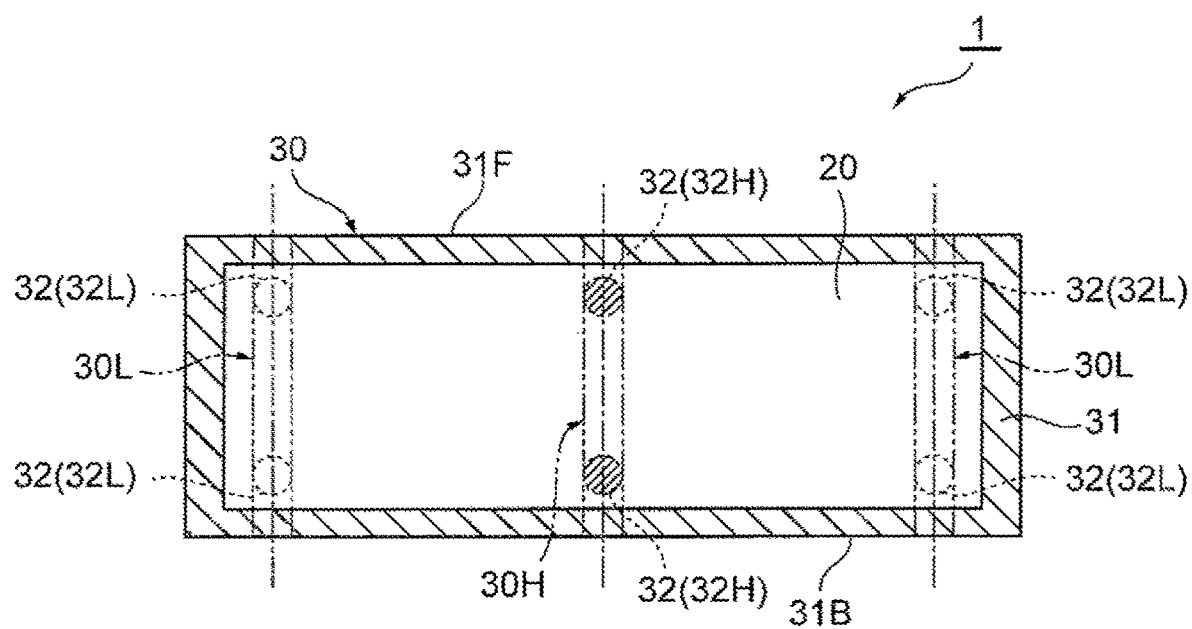
FIG. 6C is a plan cross-sectional view illustrating a third variation of the arrangement of the board support parts illustrated in FIG. 5.

In a stereo camera 1 of a third variation illustrated in FIG. 6C, like in the embodiment described above, low-rigidity support areas 30L are included at both ends in the baseline direction (X axis direction), and a high-rigidity support area 30H is included between the low-rigidity support areas 30L in the baseline direction. Further unlike the above-described embodiment, the stereo camera 1 of the third variation has a plurality of high-rigidity support parts 32H in one high-rigidity support area 30H and a plurality of low-rigidity support parts 32L in one low-rigidity support area 30L.

More specifically, the stereo camera 1 of the third variation has two high-rigidity support parts 32H arranged on a linear line parallel to the direction of the optical axis OA (Z axis direction) in the central part of a housing 30 in the baseline direction. Moreover, the stereo camera 1 of the third variation has two low-rigidity support parts 32L arranged on a linear line parallel to the direction of the optical axis OA (Z axis direction) in each of the both ends of the housing 30 in the baseline direction.

According to the stereo camera 1 of the third variation, effects similar to those of the above-described embodiment can be obtained. Furthermore, as compared with the stereo camera 1 of the above-described embodiment, by adding the high-rigidity support part 32H and the low-rigidity support part 32L that support the circuit board 20, like in the second variation illustrated in FIG. 6B, the circuit board 20 can be more stably supported, thereby further ensuring prevention of vibration of the circuit board 20.

(Fourth Variation)

Figure 6D:
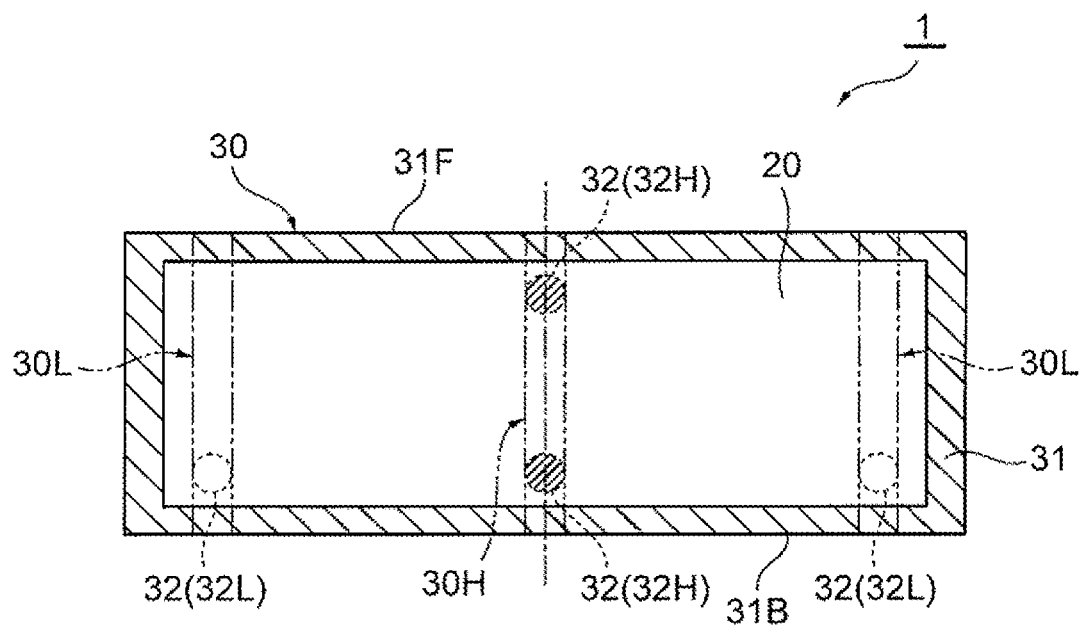
FIG. 6D is a plan cross-sectional view illustrating a fourth variation of the arrangement of the board support parts illustrated in FIG. 5.

In a stereo camera 1 of a fourth variation illustrated in FIG. 6D, like in the embodiment described above, low-rigidity support areas 30L are included at both ends in the baseline direction (X axis direction), and a high-rigidity support area 30H is included between the low-rigidity support areas 30L in the baseline direction. Unlike the above-described embodiment, the stereo camera 1 of the fourth variation has a plurality of high-rigidity support parts 32H in one high-rigidity support area 30H like in the third variation illustrated in FIG. 6C.

According to the stereo camera 1 of the fourth variation, effects similar to those of the above-described embodiment can be obtained. Furthermore, as compared with the stereo camera 1 of the above-described embodiment, by adding the high-rigidity support part 32H that supports the circuit board 20, like in the third variation illustrated in FIG. 6C, the circuit board 20 can be more stably supported, thereby further ensuring prevention of vibration of the circuit board 20.

(Fifth Variation)

Figure 6E:
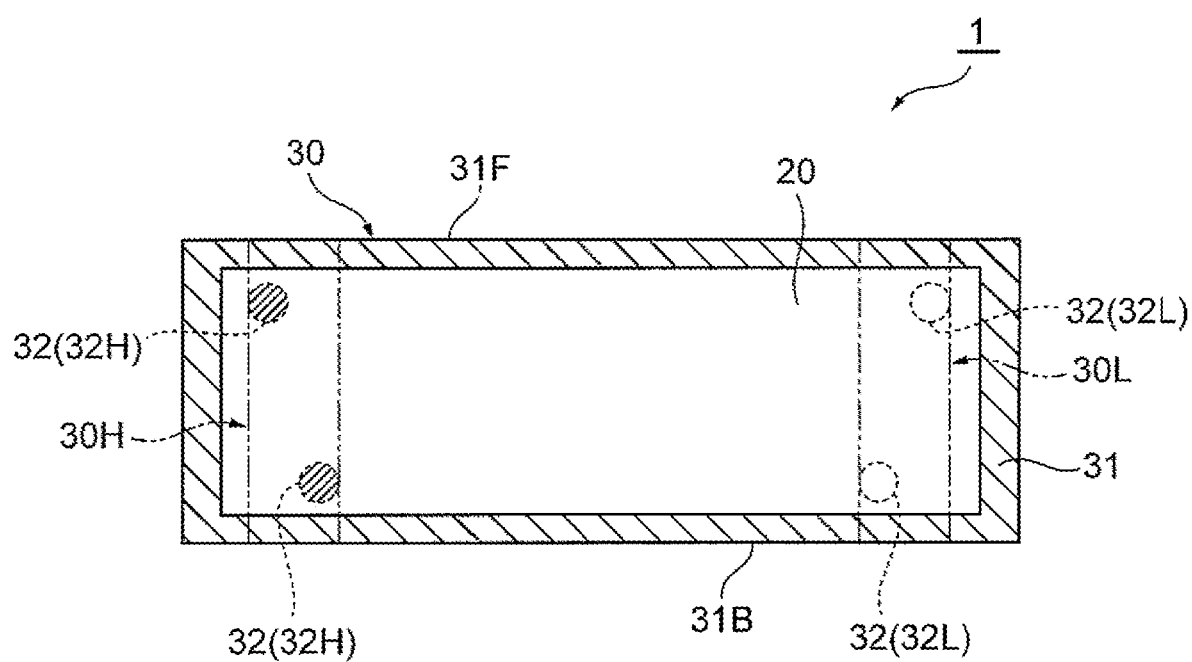
FIG. 6E is a plan cross-sectional view illustrating a fifth variation of the arrangement of the board support parts illustrated in FIG. 5.
Figure 6E:
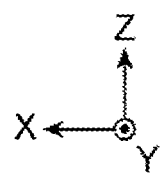

Like the stereo camera 1 of the second variation illustrated in FIG. 6B, a stereo camera 1 of a fifth variation illustrated in FIG. 6E has one high-rigidity support area 30H at one end in the baseline direction (X axis direction) and one low-rigidity support area 30L at the other end in the baseline direction. However, in the fifth variation, unlike the second variation, the high-rigidity support area 30H has a plurality of high-rigidity support parts 32H arranged while aligned in the baseline direction, and the low-rigidity support area 30L has a plurality of low-rigidity support parts 32L arranged while aligned in the baseline direction.

In the stereo camera 1 of the fifth variation, deformation due to a temperature change of the circuit board 20 in the baseline direction tends to be hindered by the two high-rigidity support parts 32H. However, if an interval between the two high-rigidity support parts 32H in the baseline direction is less than or equal to a predetermined interval, for example, less than or equal to one-fifth of the dimension of the circuit board 20 in the baseline direction, deformation that affects the parallax error can be suppressed. Furthermore, by arranging the plurality of high-rigidity support parts 32H and the plurality of low-rigidity support parts 32L arranged in the baseline direction, the degree of freedom in designing the stereo camera 1 can be improved.

(Sixth Variation)

Figure 6F:
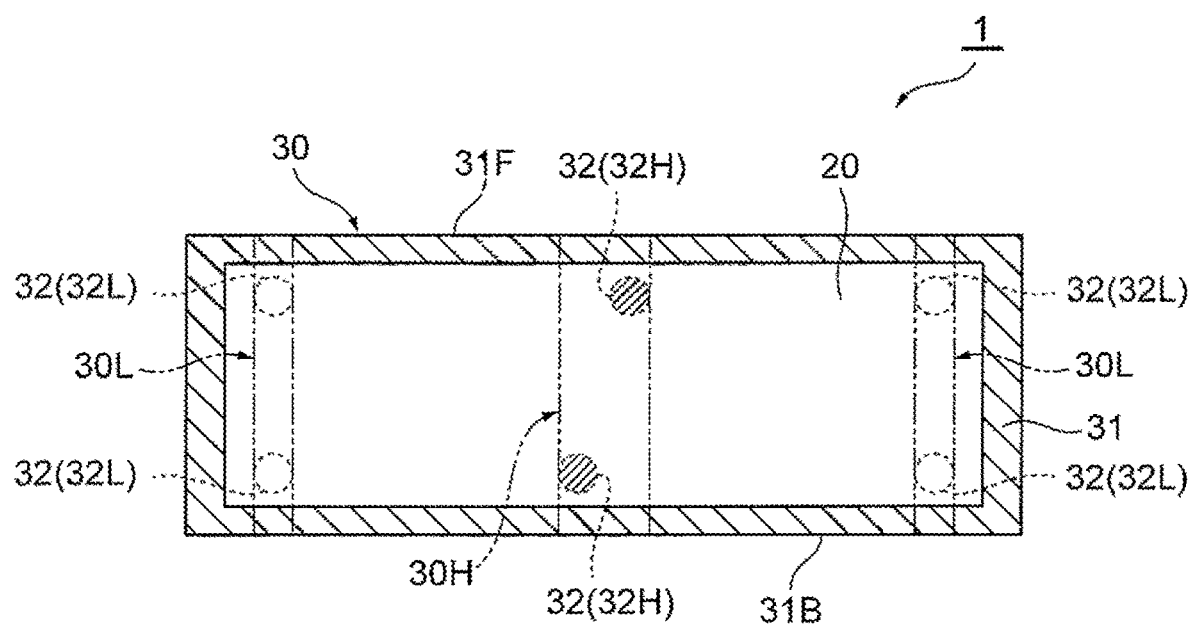
FIG. 6F is a plan cross-sectional view illustrating a sixth variation of the arrangement of the board support parts illustrated in FIG. 5.

Like the stereo camera 1 of the fifth variation illustrated in FIG. 6E, a stereo camera 1 of a sixth variation illustrated in FIG. 6F is different from the stereo camera 1 of the third variation illustrated in FIG. 6C in that a high-rigidity support area 30H has a plurality of high-rigidity support parts 32H arranged in the baseline direction. Other points of the stereo camera 1 of the sixth variation are the same as those of the stereo camera 1 of the third variation illustrated in FIG. 6C. Also in the stereo camera 1 of the sixth variation, if an interval between the two high-rigidity support parts 32H in the baseline direction is less than or equal to a predetermined interval, similar effects to those of the stereo camera 1 of the third variation illustrated in FIG. 6C can be obtained.

(Seventh Variation)

Figure 6G:
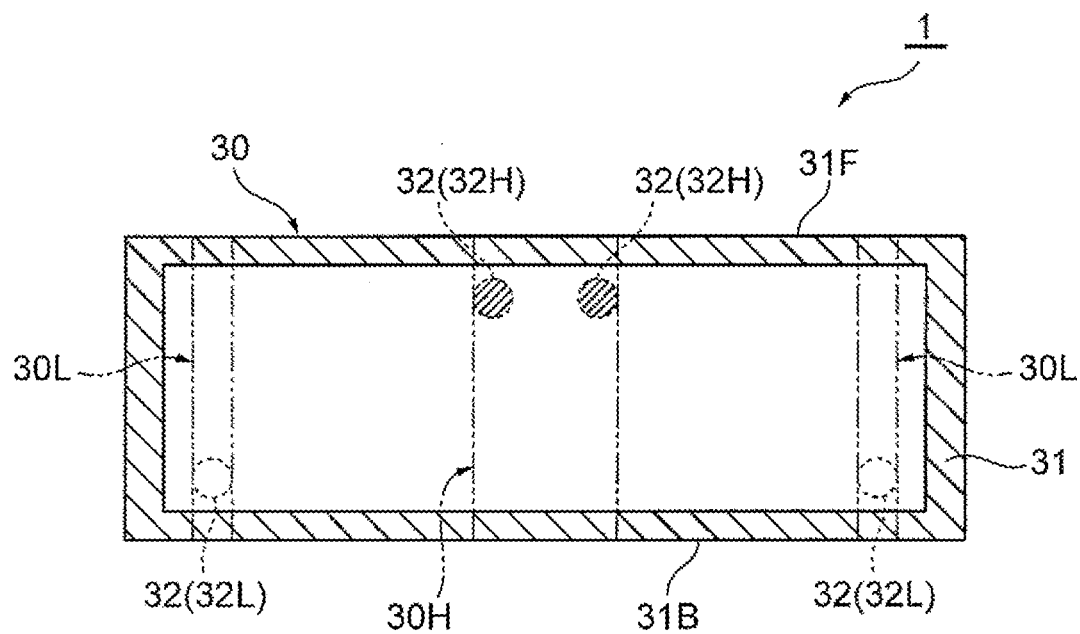
FIG. 6G is a plan cross-sectional view illustrating a seventh variation of the arrangement of the board support parts illustrated in FIG. 5.

A stereo camera 1 of a seventh variation illustrated in FIG. 6G is different from the stereo camera 1 of the above-described embodiment illustrated in FIG. 5 in that a high-rigidity support area 30H has a plurality of high-rigidity support parts 32H arranged in the baseline direction. Other points of the stereo camera 1 of the seventh variation are the same as those of the stereo camera 1 of the above-described embodiment illustrated in FIG. 5. Also in the stereo camera 1 of the seventh variation, if an interval between the two high-rigidity support parts 32H in the baseline direction is less than or equal to a predetermined interval, similar effects to those of the stereo camera 1 of the above-described embodiment illustrated in FIG. 5 can be obtained.

(Eighth Variation)

Figure 6H:
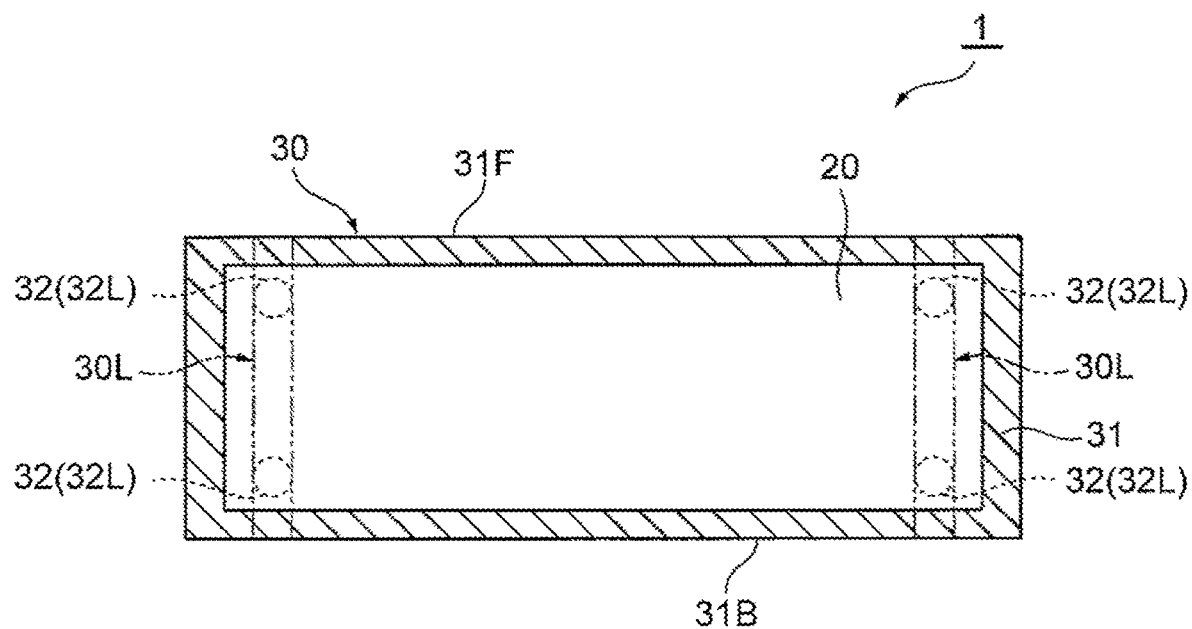
FIG. 6H is a plan cross-sectional view illustrating an eighth variation of the arrangement of the board support parts illustrated in FIG. 5.

A stereo camera 1 of an eighth variation illustrated in FIG. 6H is different from the stereo camera 1 of the second variation illustrated in FIG. 6B in that all the board support parts 32 of a housing 30 are low-rigidity support parts 32L and that a high-rigidity support area 30H nor a high-rigidity support part 32H are included. According to the stereo camera 1 of the eighth variation, like the stereo camera 1 of the above-described embodiment, deformation of the circuit board 20 due to a temperature change is accommodated by the low-rigidity support parts 32L, thereby alleviating the thermal stress acting on the main body 31. Therefore, according to the stereo camera 1 of the eighth variation, similar effects to those of the stereo camera 1 described in the above-described embodiment can be obtained.

(Ninth Variation)

Figure 7:
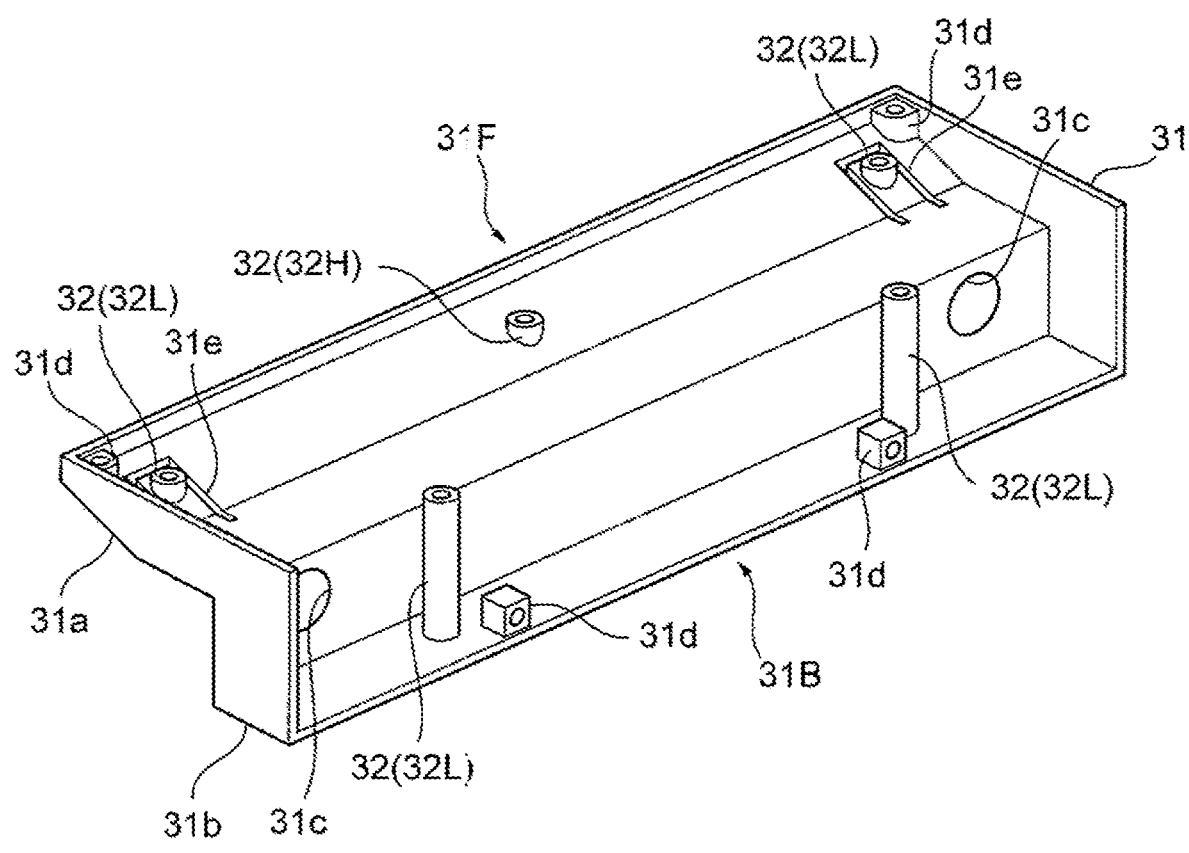
FIG. 7 is a perspective view of a main body of a housing illustrating a variation of low-rigidity support parts illustrated in FIG. 3.

FIG. 7 is a perspective view of a bottom surface side of a main body 31 of a housing 30 illustrating a variation of low-rigidity support parts 32L. In the variation illustrated in FIG. 7, the housing 30 has not only low-rigidity support parts 32L of a columnar shape provided on an inner side of a rear end 31B of the main body 31 but also low-rigidity support parts 32L of a cantilever shape provided on the front end 31F of the main body 31. That is, the low-rigidity support parts 32L provided at the front end 31F of the main body is each formed into a cantilever shape in a planar view when viewed from the height direction (Y axis direction).

Each of the low-rigidity support parts 32L of a cantilever shape is provided, with a notch 31e formed in an upper wall part of the front end 31F of the main body 31. The notch 31e is formed, for example, along two sides in a longitudinal direction and a side in a lateral direction of a low-rigidity support part 32L of a rectangular cantilever shape extending in one direction in a planar view when viewed from the height direction. That is, the notch 31e has a substantially U-shaped or channel-like shape surrounding in three directions around the low-rigidity support part 32L of a rectangular cantilever shape extending in one direction in a planar view when viewed from the height direction.

The low-rigidity support parts 32L of a cantilever shape may each have a columnar portion at the tip similarly to a high-rigidity support part 32H and a screw hole included at the tip end surface of the columnar portion. When force acts in the baseline direction on the low-rigidity support parts 32L of a cantilever shape, like a low-rigidity support part 32L of a columnar shape, the low-rigidity support parts 32L of a cantilever shape are elastically deformed more easily than the main body 31 to alleviate the stress acting on the main body 31. The low-rigidity support parts 32L of a cantilever shape have an advantage that the dimension in the height direction can be reduced as compared with a low-rigidity support part 32L of a columnar shape.

Therefore, the low-rigidity support parts 32L of a cantilever shape can be formed also on the front end 31F of the main body 31 having a relatively small height dimension. Note that the low-rigidity support parts 32L are not limited to a columnar shape or a cantilever shape. For example, instead of the notch 31e, a part of the main body 31 may be formed into a low-rigidity support part 32L by forming a thin part in that part of the main body 31.

Although embodiments of the present invention have been described in detail with reference to the drawings, specific configurations are not limited to these embodiments, and design changes or the like within the scope not departing from the principles of the present invention are included in the present invention. For example, although the examples of the stereo camera arranged close to the windshield in a compact manner has been illustrated in the above-described embodiment and variations thereof, a configuration of a stereo camera of the present invention is not limited to the above examples.

REFERENCE SIGNS LIST 1 stereo camera
10 camera module
20 circuit board
30 housing
30H high-rigidity support area
30L low-rigidity support area
31 main body
31F front end
31B rear end
32 board support part
32H high-rigidity support part
32L low-rigidity support part
BL baseline length
OA optical axis

The invention claimed is:

1. A stereo camera comprising: a pair of camera modules; a circuit board connected to the pair of camera modules; and a housing supporting the circuit board and the pair of camera modules,
wherein
the housing comprises: a high-rigidity support part and a low-rigidity support part for supporting the circuit board; a high-rigidity support area having the high-rigidity support part; and a low-rigidity support area having the low-rigidity support part,
the high-rigidity support part has higher rigidity against force acting in a baseline direction along a baseline length of the pair of camera modules than that of the low-rigidity support part,
the high-rigidity support area is included at one location adjacent to the low-rigidity support area in the baseline direction, and
the high-rigidity support area is included at one end in the baseline direction.

2. The stereo camera according to claim 1,
wherein the low-rigidity support area is included at each of both ends in the baseline direction, and
the high-rigidity support area is included between the low-rigidity support areas in the baseline direction.

3. The stereo camera according to claim 1, wherein the high-rigidity support area has one high-rigidity support part.

4. The stereo camera according to claim 1, wherein the high-rigidity support area has a plurality of high-rigidity support parts, including the high-rigidity support part, arranged in a direction intersecting with the baseline direction.

5. The stereo camera according to claim 1, wherein the high-rigidity support area has a plurality of high-rigidity support parts, including the high-rigidity support part, arranged in the baseline direction.

6. The stereo camera according to claim 1,
wherein the housing has a front end and a rear end in an optical axis direction of the camera modules, and
the front end has a smaller height dimension in a height direction perpendicular to the baseline direction and the optical axis direction than that of the rear end.

7. The stereo camera according to claim 6, wherein the low-rigidity support part is included at the rear end of the housing and formed into a columnar shape in which the height direction is an axial direction.

8. The stereo camera according to claim 6, wherein the low-rigidity support part is included at the front end of the housing and formed into a cantilever shape in a planar view when viewed from the height direction.

9. The stereo camera according to claim 1, wherein the low-rigidity support part and the high-rigidity support part are arranged on an inner side between the pair of camera modules in the baseline direction.

10. A stereo camera comprising: a pair of camera modules; a circuit board connected to the pair of camera modules; and a housing supporting the circuit board and the pair of camera modules,
wherein
the housing comprises: a high-rigidity support part and a low-rigidity support part for supporting the circuit board; a high-rigidity support area having the high-rigidity support part; and a low-rigidity support area having the low-rigidity support part,
the high-rigidity support part has higher rigidity against force acting in a baseline direction along a baseline length of the pair of camera modules than that of the low-rigidity support part,
the high-rigidity support area is included at one location adjacent to the low-rigidity support area in the baseline direction,
the housing has a front end and a rear end in an optical axis direction of the camera modules, and
the front end has a smaller height dimension in a height direction perpendicular to the baseline direction and the optical axis direction than that of the rear end.

11. The stereo camera according to claim 10,
wherein the low-rigidity support area is included at each of both ends in the baseline direction, and
the high-rigidity support area is included between the low-rigidity support areas in the baseline direction.

12. The stereo camera according to claim 10, wherein the high-rigidity support area has one high-rigidity support part.

13. The stereo camera according to claim 10, wherein the high-rigidity support area has a plurality of high-rigidity support parts, including the high-rigidity support part, arranged in a direction intersecting with the baseline direction.

14. The stereo camera according to claim 10, wherein the high-rigidity support area has a plurality of high-rigidity support parts, including the high-rigidity support part, arranged in the baseline direction.

15. The stereo camera according to claim 10, wherein the low-rigidity support part is included at the rear end of the housing and formed into a columnar shape in which the height direction is an axial direction.

16. The stereo camera according to claim 10, wherein the low-rigidity support part is included at the front end of the housing and formed into a cantilever shape in a planar view when viewed from the height direction.

17. The stereo camera according to claim 10, wherein the low-rigidity support part and the high-rigidity support part are arranged on an inner side between the pair of camera modules in the baseline direction.

* * * * *